US009105495B2

(12) United States Patent
Wang et al.

(10) Patent No.: US 9,105,495 B2
(45) Date of Patent: Aug. 11, 2015

(54) SEMICONDUCTOR DEVICE AND RELATED FABRICATION METHODS

(75) Inventors: Peilin Wang, Beijing (CN); Jingjing Chen, Torrance, CA (US); Edouard D. De Fresart, Tempe, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 155 days.

(21) Appl. No.: 13/983,653

(22) PCT Filed: Feb. 12, 2011

(86) PCT No.: PCT/CN2011/000220
§ 371 (c)(1),
(2), (4) Date: Nov. 27, 2013

(87) PCT Pub. No.: WO2012/106834
PCT Pub. Date: Aug. 16, 2012

(65) Prior Publication Data
US 2015/0162328 A1    Jun. 11, 2015

(51) Int. Cl.
H01L 29/76    (2006.01)
H01L 29/94    (2006.01)
H01L 31/062   (2012.01)
H01L 31/113   (2006.01)
H01L 31/119   (2006.01)
H01L 21/336   (2006.01)
(Continued)

(52) U.S. Cl.
CPC ............ *H01L 27/088* (2013.01); *H01L 21/265* (2013.01); *H01L 21/823456* (2013.01); *H01L 29/4236* (2013.01); *H01L 29/66666* (2013.01); *H01L 29/66712* (2013.01); *H01L 29/7803* (2013.01); *H01L 29/7827* (2013.01)

(58) Field of Classification Search
CPC .................... H01L 21/265; H01L 21/823456; H01L 27/088; H01L 29/7803; H01L 29/66712; H01L 29/66666
USPC .................................... 257/330, 334; 438/270
See application file for complete search history.

(56) References Cited

U.S. PATENT DOCUMENTS 6,670,244 B2   12/2003   Gassel et al.
7,071,513 B1   7/2006    Dyer et al.
(Continued)

FOREIGN PATENT DOCUMENTS

JP   H06244429 A   9/1994
JP   H07058332     3/1995
(Continued)

*Primary Examiner* — David S Blum

(57) ABSTRACT

Semiconductor device structures and related fabrication methods are provided. An exemplary semiconductor device structure (100) includes a trench gate structure (114), a lateral gate structure (118), a body region (124) having a first conductivity type, a drain region (125) and first and second source regions (128, 130) having a second conductivity type. The first and second source regions (128, 130) are formed within the body region (124). The drain region (125) is adjacent to the body region (124) and the first source region (128) is adjacent to the trench gate structure (114), wherein a first portion of the body region (124) disposed between the first source region (128) and the drain region (125) is adjacent to the trench gate structure (114). A second portion of the body region (124) is disposed between the second source region (130) and the drain region (125), and the lateral gate structure (118) is disposed overlying the second portion of the body region (124).

20 Claims, 7 Drawing Sheets

(51) Int. Cl.
*H01L 27/088* (2006.01)
*H01L 29/78* (2006.01)
*H01L 29/66* (2006.01)
*H01L 29/423* (2006.01)
*H01L 21/265* (2006.01)
*H01L 21/8234* (2006.01)

(56) References Cited

U.S. PATENT DOCUMENTS

| | | |
|---|---|---|
| 7,411,249 B1 | 8/2008 | Blanchard |
| 7,535,057 B2 | 5/2009 | Yang |
| 7,576,388 B1 | 8/2009 | Wilson et al. |
| 7,671,408 B2 | 3/2010 | Denison |
| 8,513,087 B2 * | 8/2013 | Disney et al. ............... 438/418 |
| 2006/0237782 A1 | 10/2006 | Zeng et al. |
| 2008/0157193 A1 * | 7/2008 | Pang ........................... 257/334 |

FOREIGN PATENT DOCUMENTS

| | | |
|---|---|---|
| JP | S62037965 | 2/1997 |
| JP | H09205204 | 8/1997 |
| JP | H11-345964 | 12/1999 |
| JP | 2001250947 A | 9/2001 |
| JP | 2005203395 A | 7/2005 |
| JP | 2009117828 A | 5/2009 |
| JP | 2010206111 A | 9/2010 |
| JP | 2001127285 A | 5/2011 |

* cited by examiner ical FIELD

SEMICONDUCTOR DEVICE AND RELATED FABRICATION METHODS

TECHNICAL FIELD

Embodiments of the subject matter described herein relate generally to semiconductor devices and methods for fabricating semiconductor devices, and more particularly, embodiments of the subject matter relate to methods for fabricating trench field effect transistor structures that include lateral gate structures.

BACKGROUND

Decreasing transistor size has traditionally been a high priority in the semiconductor manufacturing industry. Trench metal oxide semiconductor field-effect transistors (MOSFETs) are commonly used to provide desired transistor functionality with reduced die size relative to lateral MOSFET devices. Traditionally, the required size of a trench MOSFET was dictated by the desired on-state resistance. More recently, the required size of a trench MOSFET is dictated by the desired energy (or current) capability and/or the desired thermal stability.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

FIGS. 1-12 illustrate methods for fabricating a semiconductor device structure 100 in accordance with exemplary embodiments. As described in greater detail below, the semiconductor device structure 100 is a hybrid of trench metal oxide semiconductor field-effect transistor (MOSFET) and a vertically diffused metal oxide semiconductor (VDMOS). In other words, the semiconductor device structure 100 includes a trench MOSFET structure and a VDMOS structure that share a common drain region and body region. Although "MOS" properly refers to a device having a metal gate electrode and an oxide gate insulator, the subject matter may be utilized with any semiconductor device that includes a conductive gate electrode (whether metal or other conductive material) that is positioned with respect to a gate insulator (whether oxide or other insulator) which, in turn, is positioned with respect to a semiconductor substrate to implement a field-effect transistor, and the subject matter is not intended to be limited to a metal gate electrode and an oxide gate insulator. Furthermore, it should be appreciated that although the subject matter may be described herein in the context of an N-type (or N-channel) device, the subject matter is not intended to be limited to N-type devices and may be implemented in an equivalent manner for a P-type (or P-channel) device. Various steps in the manufacture of MOS devices are well known and so, in the interest of brevity, many conventional steps will only be mentioned briefly herein or will be omitted entirely without providing the well known process details.

Figure 1:
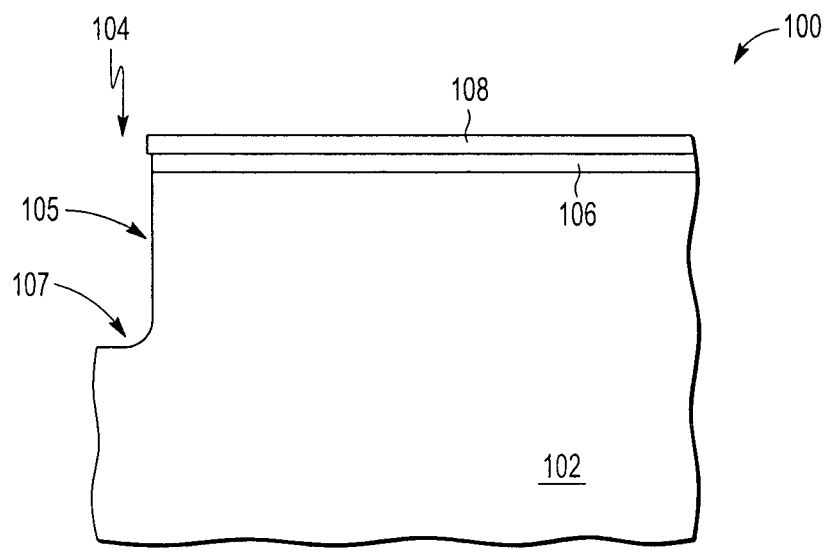
FIGS. 1-12 illustrate cross-sectional and top views of a semiconductor device structure and exemplary methods for fabricating the semiconductor device structure in accordance with one or more embodiments of the invention.

Referring to FIG. 1, the illustrated fabrication process begins by providing an appropriate substrate of semiconductor material 102 and forming a voided region 104 (alternatively referred to herein as a trench) in the semiconductor material 102. In an exemplary embodiment, the semiconductor material 102 is realized as a silicon material as typically used in the semiconductor industry (e.g., relatively pure silicon or silicon admixed with other elements such as germanium, carbon, and the like), although it will be appreciated that other semiconductor materials may be used in alternative embodiments. Accordingly, for convenience, but without limitation, the semiconductor material 102 is alternatively referred to herein as silicon material. In an exemplary embodiment, the silicon material 102 is doped with ions of a conductivity-determining impurity type to provide an electrode region or terminal region (e.g., a drain region) for the device structure 100. For example, for an N-channel device, the silicon material 102 may be doped with N-type ions, such as phosphorous ions (or a phosphorous ionized species), having a dopant concentration of about $1.0 \times 10^{16}/cm^3$. In accordance with one embodiment, the doped silicon material 102 is formed by epitaxially growing the silicon material 102 on a semiconductor substrate (e.g., a bulk silicon substrate, a silicon on insulator substrate, or the like) and in-situ doping the silicon material 102 by adding phosphorous ions to the reactants used to epitaxially grow the silicon material 102.

In an exemplary embodiment, the trench 104 is formed by forming a layer of masking material overlying the silicon material 102, patterning the masking material to expose a portion of the silicon material 102 to be removed, and selectively removing the exposed portion of the silicon material 102 using the remaining masking material as an etch mask. In the illustrated embodiment, a layer of dielectric material 106, such as an oxide material, is formed overlying the silicon material 102, and a layer of masking material 108 is formed overlying the dielectric material 106. The layer of masking material 108 may be formed by conformably depositing a hard mask material, such as a nitride material (e.g., silicon nitride, silicon oxynitride, or the like), overlying the layer of dielectric material 106 to accommodate the selective etching of underlying silicon material 102 when subsequently used as an etch mask. For convenience, but without limitation, the masking material 108 may hereinafter be referred to as the pad nitride. In an exemplary embodiment, the pad nitride 108 is patterned to expose the portion of the silicon material 102 to be removed for trench 104 while masking the remaining silicon material 102, and an anisotropic etchant is utilized to remove exposed (or unprotected) portions of the dielectric material 106 and the silicon material 102 to form the trench 104. For example, the exposed portion of silicon material 102 may be anisotropically etched by plasma-based reactive ion etching (RIE) using an anisotropic etchant chemistry, such as a fluorocarbon-based plasma chemistry that etches the silicon material 102 with good selectivity relative to the pad nitride 108. In accordance with one or more embodiments, the trench 104 is etched to a depth in the range of about one to two micrometers (or microns) relative to the surface of the silicon material 102. The trench 104 in the silicon material 102 defines the dimensions and/or shape of a trench gate structure subsequently formed therein, as described in greater detail below in the context of FIG. 3.

In accordance with one or more embodiments, after forming the trench 104, the fabrication process continues by forming a sacrificial oxide layer in the trench 104 and removing the sacrificial oxide layer to reduce the roughness of the bottom and sidewall surfaces of the trench 104 and round the corners of the trench 104 to prevent creation of uneven electric fields at the corners of the trench 104. For example, a sacrificial oxide layer may be thermally grown on the bottom surface 107 and the sidewall surface 105 of the trench 104 by exposing the device structure 100 of FIG. 1 to an oxidizing ambient at an elevated temperature that promotes selective growth of oxide material on the exposed surfaces 105, 107 of the silicon material 102. In an exemplary embodiment, the sacrificial oxide layer is formed to a thickness in the range of about 30 nanometers (nm) to about 100 nm. In practice, during the oxidation process, oxide material may also grow on the exposed dielectric material 106 and/or pad nitride 108, however, the oxidation rate of the silicon material 102 is sufficiently greater than the oxidation rate of the dielectric material 106 and/or pad nitride 108 such that the amount of oxide material formed on the dielectric material 106 and/or pad nitride 108 is negligible. The sacrificial oxide layer is then completely removed from the bottom and sidewall surfaces 105, 107 of the trench 104 using an isotropic etchant chemistry that etches oxide material with good selectivity relative to the pad nitride 108, such that the dielectric material 106 and pad nitride 108 remain substantially intact after the sacrificial oxide layer is removed (although the dielectric material 106 and/or pad nitride 108 may be partially etched). As illustrated in FIG. 1, the formation and subsequent etching of the sacrificial oxide layer rounds the corners and edges of the trench 104, including where the bottom surface 107 and sidewall surface 105 intersect and where the sidewall surface 105 and the upper surface of the silicon material 102 intersect, to improve uniformity of a gate dielectric material for a trench gate structure subsequently formed in the trench 104 and reduce peak electric fields at the corners of the trench 104.

Figure 2:
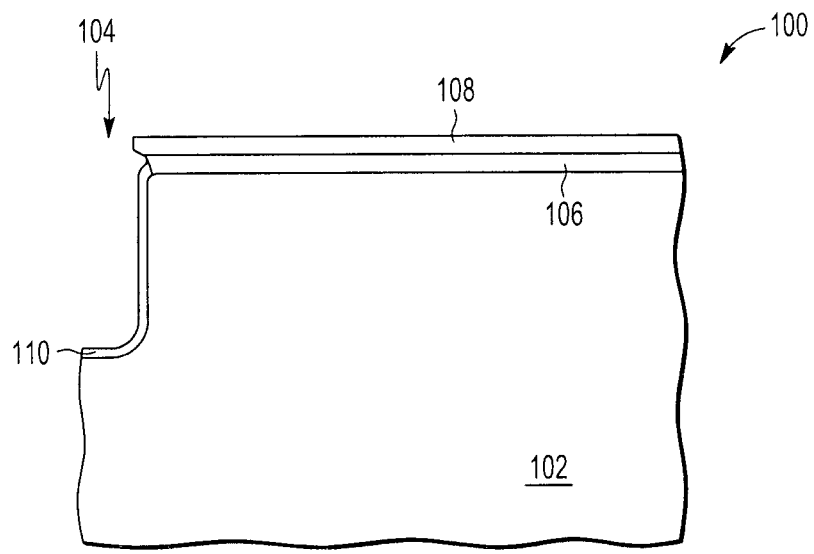

Referring now to FIG. 2, in an exemplary embodiment, the fabrication process continues by forming a layer of dielectric material 110 in the trench 104. The dielectric material 110 functions as the gate insulator for a trench gate structure formed in the trench 104, as described in greater detail below. In an exemplary embodiment, the layer of dielectric material 110 is formed by thermally growing an oxide material, such as silicon dioxide, on the exposed bottom and sidewall surfaces 105, 107 of the trench 104 by exposing the device structure 100 to an oxidizing ambient at temperature in the range of about 800° C. to about 1000° C. to promote selective growth of oxide material on the exposed surfaces 105, 107 of silicon material 102 in the trench 104. For convenience, but without limitation, the dielectric material 110 is alternatively referred to herein as an oxide material. In an exemplary embodiment, the oxide material 110 is grown to a thickness of about 70 nm. In practice, during the oxidation process, oxide material may also grow on the exposed dielectric material 106 and/or pad nitride 108, however, the oxidation rate of the silicon material 102 is sufficiently greater than the oxidation rate of the dielectric material 106 and/or pad nitride 108 such that the amount of oxide material formed on the dielectric material 106 and/or pad nitride 108 is negligible as compared to the oxide material 110 grown in the trench 104. It should be noted that in some alternative embodiments, the dielectric material 110 may be realized as a high-k dielectric material, and/or the dielectric material 110 may be formed in the trench 104 using a deposition process in lieu of the thermal oxidation process described above.

Figure 3:
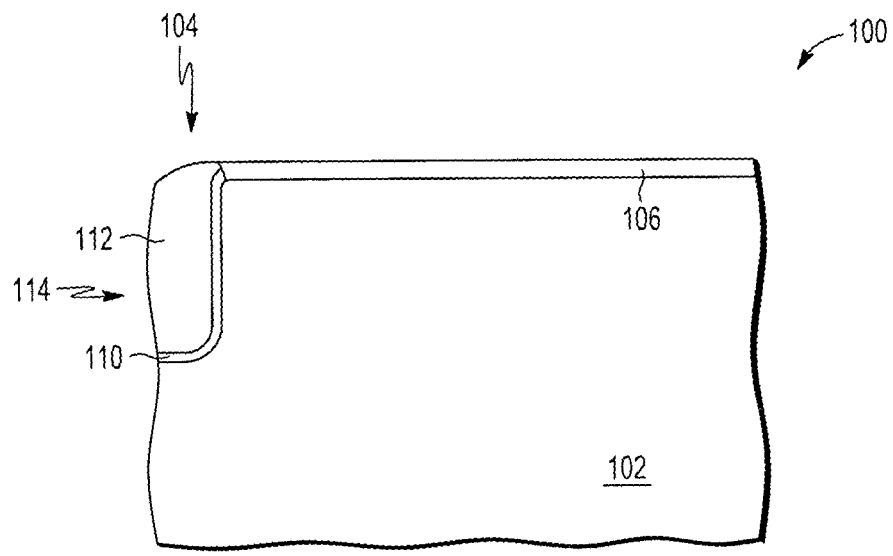

Referring now to FIG. 3, in an exemplary embodiment, the fabrication process continues by forming a layer of a conductive material 112 in the trench 104 to create a trench gate structure 114 for the device structure 100. In this regard, the conductive material 112 functions as the conductive gate electrode material of the trench gate structure 114. In an exemplary embodiment, the conductive material 112 is realized as polycrystalline silicon material that is conformably deposited overlying the device structure 100 of FIG. 2 by chemical vapor deposition (CVD) process at a temperature in the range of about 700° C. to about 1000° C. to a thickness greater than or equal to the depth of the trench 104 relative to the surface of the silicon material 102. For convenience, but without limitation, the conductive material 112 in the trench 104 may alternatively be referred to as the first polysilicon material. In an exemplary embodiment, the first polysilicon material 112 is in-situ doped by adding impurity-doping elements having the same conductivity-type as the doped silicon material 102 to the reactants used to form the first polysilicon material 112. For the exemplary N-channel device described herein, N-type impurity-doping elements, such as arsenic ions having a dopant concentration of about $6.5 \times 10^{20}/cm^3$, are added to the reactants used to form the first polysilicon material 112.

After conformably depositing the first polysilicon material 112 overlying the device structure 100 of FIG. 2, the fabrication process continues by removing any excess polysilicon material 112 that is not formed in the trench 104. In this regard, in accordance with one embodiment, the excess polysilicon material 112 is removed using etch back planarization by performing RIE using an anisotropic etchant to remove the polysilicon material 112 until the upper surface of the pad nitride 108 is exposed. In some embodiments, the anisotropic etching may continue by removing some or all of the pad nitride 108 to reduce the height of the polysilicon material 112 in the trench 104 to a height more closely aligned with the surface of the silicon material 102. After performing the etch back of the excess polysilicon material 112, any remaining pad nitride 108 may be removed by performing a hot phosphoric acid etching process or another known etching process to obtain the device structure 100 of FIG. 3. The remaining polysilicon material 112 in the trench 104 functions as an N+ trench gate structure 114 for the exemplary N-type hybrid trench VDMOS device structure 100 described herein. It should be noted that in alternative embodiments, in lieu of the etch back process described above, chemical-mechanical planarization (CMP) may be used to polish the polysilicon material 112 with a chemical slurry for a predetermined amount of time such that the CMP stops when the upper surface of the pad nitride 108 and/or silicon material 102 is exposed.

Figure 4:
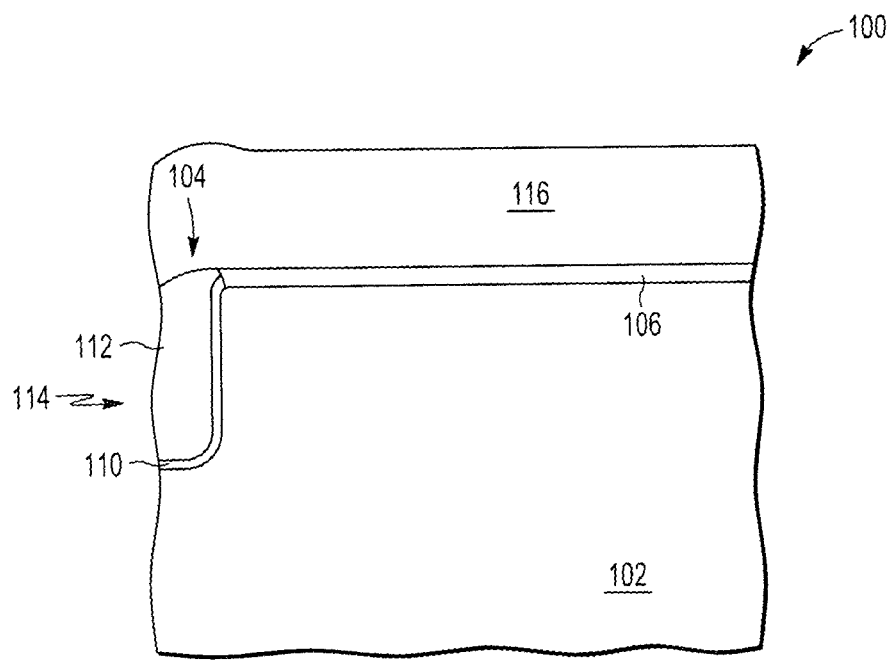
Figure 5:
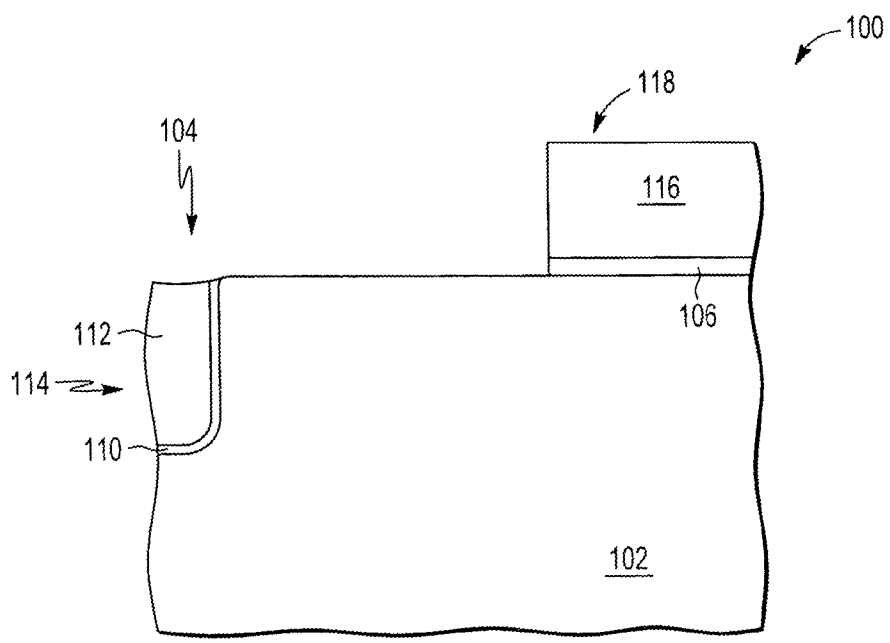
Figure 6:
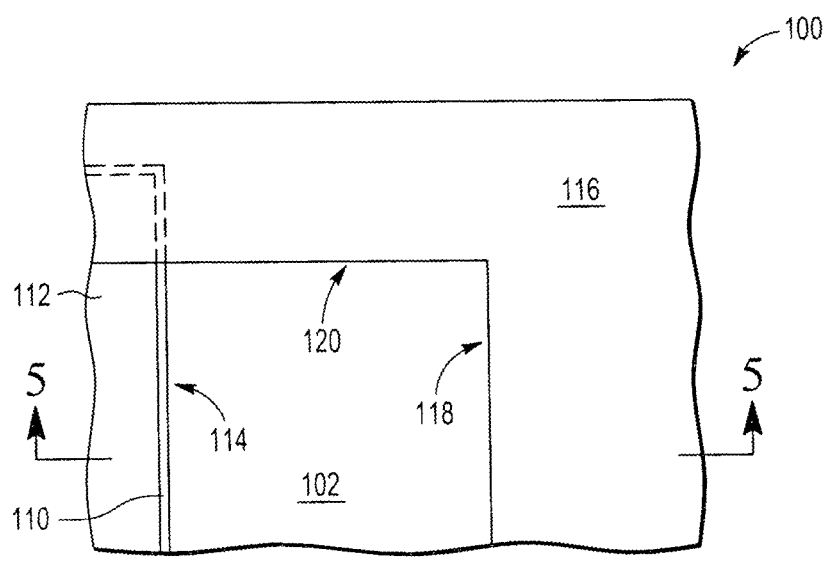

Referring now to FIGS. 4-6, in an exemplary embodiment, after forming the polysilicon material 112 in the trench 104, the fabrication process continues by forming a layer of a second conductive material 116 overlying the device structure 100 of FIG. 3 and selectively removing portions of the second conductive material 116 to define a lateral gate structure 118 overlying the silicon material 102. In this regard, the second conductive material 116 functions as the conductive gate electrode material of the lateral gate structure 118 and the underlying portion of dielectric material 106 remaining after removing portions of the second conductive material 116 functions as the gate insulator for the lateral gate structure 118. In an exemplary embodiment, the conductive material 116 is realized as an undoped polycrystalline silicon material that is conformably deposited overlying the device structure 100 of FIG. 3 by performing CVD at a temperature in the range of about 700° C. to about 1000° C. to a thickness in the range of about 500 nm to about 800 nm, resulting in the device structure 100 of FIG. 4. In this manner, in some embodiments, the second conductive material 116 fills any unoccupied space that may exist within the trench 104 below the surface of the silicon material 102 after the etch back of the first polysilicon material 112. For convenience, but without limitation, the conductive material 116 may alternatively be referred to as the second polysilicon material to distinguish from the first polysilicon material 112 used for the trench gate structure 114.

Referring now to FIG. 5, after conformably depositing the second polysilicon material 116, the fabrication process continues by selectively removing portions of the second polysilicon material 116 overlying the trench 104 and the silicon material 102 to define the lateral gate structure 118 overlying the silicon material 102. For example, a layer of masking material (e.g., a photoresist material, a nitride material, or the like) may be formed overlying the second polysilicon material 116, and portions of the masking material may be selectively removed (e.g., using photolithography or a suitable etchant chemistry) to define an etch mask that exposes the portions of the second polysilicon material 116 overlying the trench gate structure 114 and a region of the silicon material 102 adjacent to the trench 104 and/or trench gate structure 114, that is, the region of silicon material 102 between the trench gate structure 114 and the subsequently formed lateral gate structure 118. As described in greater detail below, the region of silicon material 102 between the trench gate structure 114 and the lateral gate structure 118 is subsequently doped to provide a body region for the device structure 100. The exposed portions of the second polysilicon material 116 are selectively removed using the etch mask by performing RIE using an anisotropic etchant to remove the exposed portions of the second polysilicon material 116 while leaving the masked portions of the second polysilicon material 116 intact to create the lateral gate structure 118. In an exemplary embodiment, the second polysilicon material 116 is etched until the exposing the surfaces of the unmasked portions of silicon material 102. In this regard, the etchant chemistry or etch conditions used to etch the second polysilicon material 116 may etch any exposed portions of the dielectric material 106.

FIG. 6 depicts a top view of the device structure 100 of FIG. 5 after etching the second polysilicon material 116. As illustrated in FIGS. 5-6, the width of the lateral gate structure 118 is substantially parallel to the width of the trench gate structure 114, and the gate structures 114, 118 are spaced apart by the region of silicon material 102 that is subsequently doped to provide the body region for the device structure 100. As illustrated in FIG. 6, in an exemplary embodiment, the etch mask used to form the lateral gate structure 118 is patterned to mask a portion 120 of the second polysilicon material 116 deposited overlying a portion of the trench gate structure 114 that extends beyond the width of the silicon material 102. Thus, the masked portion 120 of the second polysilicon material 116 remains intact after etching to create the lateral gate structure 118, and the masked portion 120 extends orthogonally to (or perpendicular to) the widths of the gate structures 114, 118 between the two gate structures 114, 118 to provide an electrical connection between the trench gate structure 114 and the lateral gate structure 118. In an exemplary embodiment, the portion 120 functions as a gate terminal (or gate feed) for the device structure 100 that is capable of being accessed or otherwise being connected to external devices or overlying metal interconnect layers in a conventional manner. As illustrated in FIG. 6, the portion 120 of second polysilicon material 116 is contiguous or otherwise in contact with both the lateral gate structure 118 and the first polysilicon material 112 of the extension of the trench gate structure 114. In this manner, the trench gate structure 114 and the lateral gate structure 118 are electrically connected and have substantially the same electrical potential and, in combination, function as a common gate electrode for the hybrid trench VDMOS device structure 100, as described in greater detail below.

Figure 7:
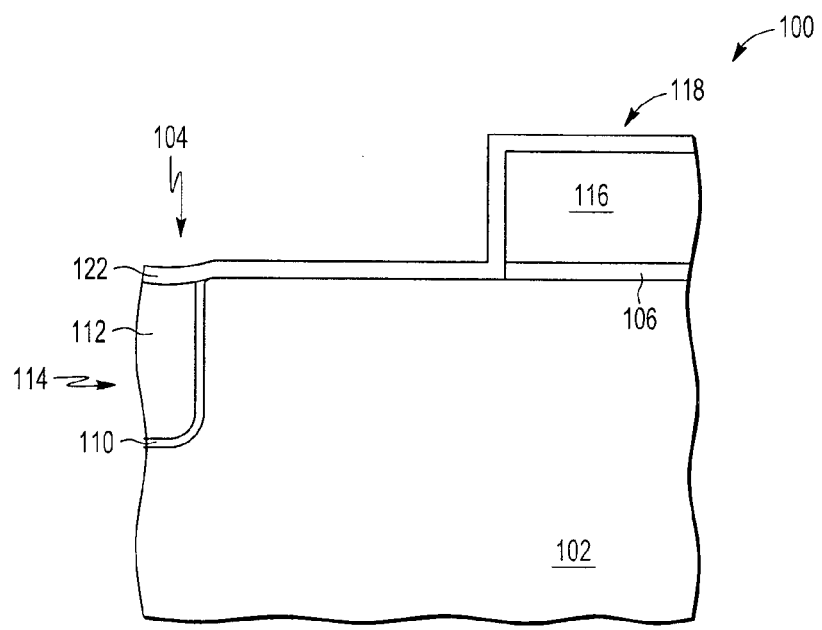

Referring now to FIG. 7, in an exemplary embodiment, after forming the lateral gate structure 118, the fabrication process continues by forming a layer of dielectric material 122, such as an oxide material, overlying the trench gate structure 114, the lateral gate structure 118, and the silicon material 102. In an exemplary embodiment, the layer of oxide material 122 is thermally grown on exposed surfaces of silicon material 102 and polysilicon materials 112, 116 by exposing the device structure 100 of FIG. 6 to an oxidizing ambient at temperature in the range of about 800° C. to about 1000° C. to promote selective growth of oxide material on the exposed silicon to a thickness in the range of about 10 nm to about 30 nm. The oxide material 122 has a substantially uniform thickness across the device structure 100 to allow subsequent ion implantation process steps to achieve more uniform dopant profiles. It should be noted that in alternative embodiments, the oxide material 122 may be deposited overlying the trench gate structure 114, the lateral gate structure 118, and the silicon material 102 by performing a deposition process in lieu of the thermal oxidation process described above.

Figure 8:
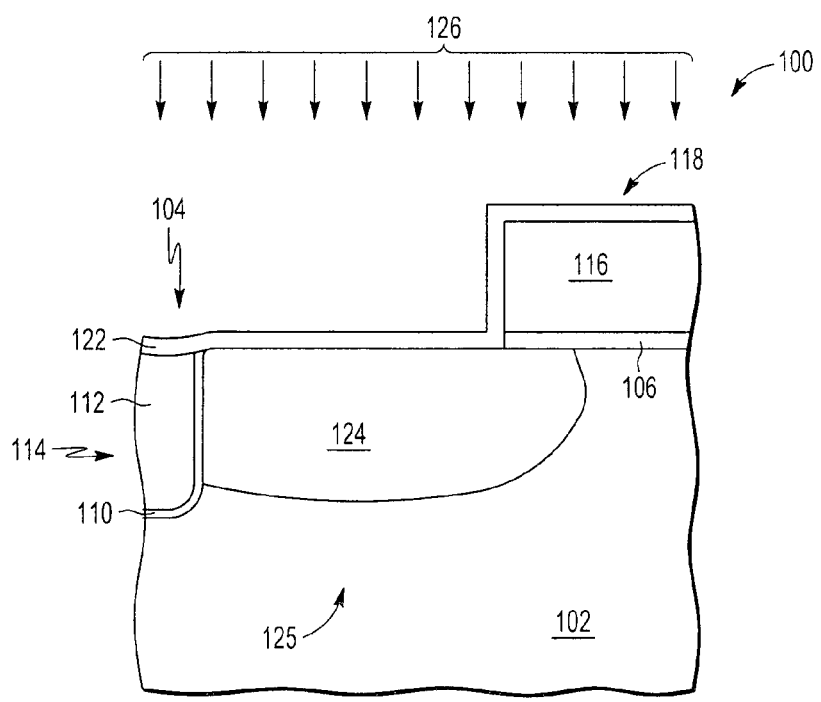

Referring now to FIG. 8, in an exemplary embodiment, the fabrication process continues by forming a body region 124 in the region of silicon material 102 between the trench gate structure 114 and the lateral gate structure 118 by implanting ions (illustrated by arrows 126) of a conductivity-determining impurity type that is opposite the conductivity type of the silicon material 102 and the first polysilicon material 112. For example, for an exemplary N-channel device, the body region 124 is formed by implanting P-type ions, such as, boron ions (or a boron ionized species), with a dopant concentration in the range of about $1\times10^{13}/cm^3$ to about $2\times10^{13}/cm^3$ at an energy level of about 40 keV to about 100 keV to provide the body region 124 having a depth slightly less than the depth of the trench 104. After implanting ions 126, the fabrication process continues by performing a high-temperature annealing process to drive the implanted ions and activate the body region 124. In an exemplary embodiment, the device structure 100 may be heated to a temperature between about 600° C. to about 1100° C. for about eighty to one-hundred and sixty minutes using a furnace anneal to activate the body region 124. In an exemplary embodiment, the implanted ions diffuse vertically to provide a depth of the portion of the body region 124 adjacent to the trench gate structure 114 that is about 0.1 to 0.2 micrometers less than the depth of the trench 104 relative to the surface of the silicon material 102. Additionally, the implanted ions diffuse laterally such that the body region 124 extends laterally underneath the lateral gate structure 118, as shown in FIG. 8. The body region 124 functions as the P-body portion of the body region of the N-type device structure 100 while the remaining portion 125 of the silicon material 102 that is not doped during the formation of the P-body region 124 (e.g., the portion of the silicon material 102 that ions 126 do not diffuse into) function as the N+ drain region for the N-type device structure 100. In some embodiments, the gate structures 114, 118 may be masked prior to implanting the ions 126 for the body region 124. However, due to the relatively low dopant concentration for the ions 126 relative to the dopant concentration of the first polysilicon material 112 and subsequent ion implantation steps, the ions 126 may be implanted while the gate structures 114, 118 are unmasked without impacting performance of the device structure 100. Additionally, in yet other embodiments, a sidewall spacer may be formed about the lateral gate structure 118 in a conventional manner to control the lateral extension of the body region 124 under the lateral gate structure 118.

Figure 9:
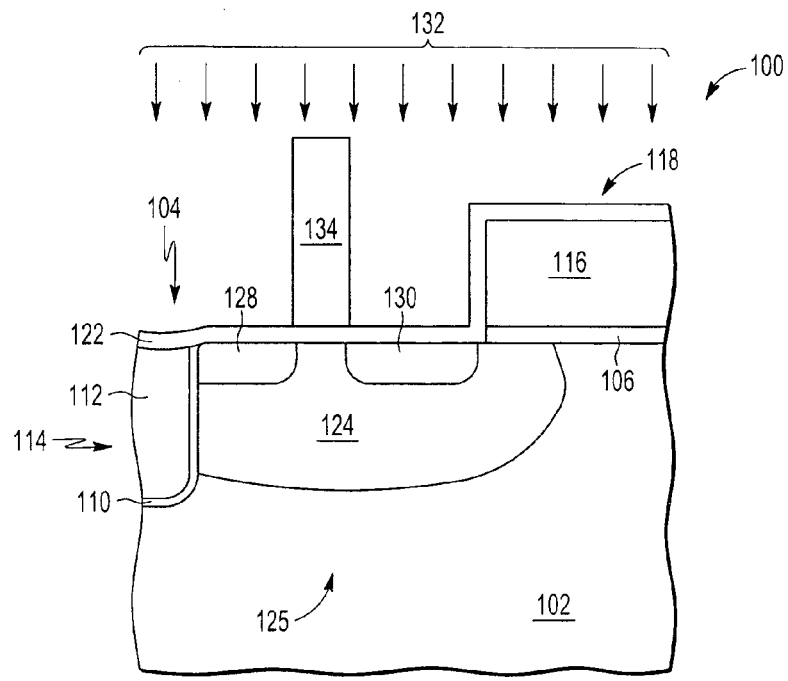

Referring now to FIG. 9, in an exemplary embodiment, after forming the body region 124, the fabrication process continues by forming electrode regions or terminal regions (e.g., source regions) within the body region 124 by implanting ions (illustrated by arrows 132) of a conductivity-determining impurity type that is opposite the conductivity type of the body region 124. In an exemplary embodiment, source regions 128, 130 are formed within the body region 124 by masking the device structure 100 of FIG. 8 with an implantation mask 134 (e.g., photoresist or the like) that masks the central (or interior) portion of the body region 124 and leaves exposed portions of the body region 124 adjacent to the gate structures 114, 118. The source regions 128, 130 are then formed by implanting ions 132 of the conductivity-determining impurity type opposite the conductivity-type of the body region 124 using the implantation mask 134. As illustrated, the depth of the implantation for the source regions 128, 130 is less than the depth of the body region 124 relative to the surface of the silicon material 102, such that a portion of the body region 124 adjacent to the trench 104 is disposed underlying the source region 128 and overlying a portion of the drain region 125 adjacent to the trench 104. In accordance with one embodiment, for an N-channel device, N+ source regions 128, 130 are formed by performing a co-implantation step by implanting phosphorous ions (or a phosphorous ionized species) with a dopant concentration of about $1.5 \times 10^{15}/cm^3$ and energy level in the range of about 40 keV to about 100 keV and implanting arsenic ions (or an arsenic ionized species) with a dopant concentration of about $6 \times 10^{15}/cm^3$ and energy level in the range of about 60 keV to about 120 keV. In an exemplary embodiment, the gate structures 114, 118 are not masked and doped by implanting ions 132 into the exposed polysilicon material 112, 116 during the formation of source regions 128, 130. After implanting ions 132, the fabrication process continues by removing the mask 134 and performing a high-temperature annealing process to drive the implanted ions and activate the source regions 128, 130. In an exemplary embodiment, the device structure 100 is heated to a temperature of about 1000° C. for about thirty minutes using a furnace anneal to activate the source regions 128, 130.

Figure 10:
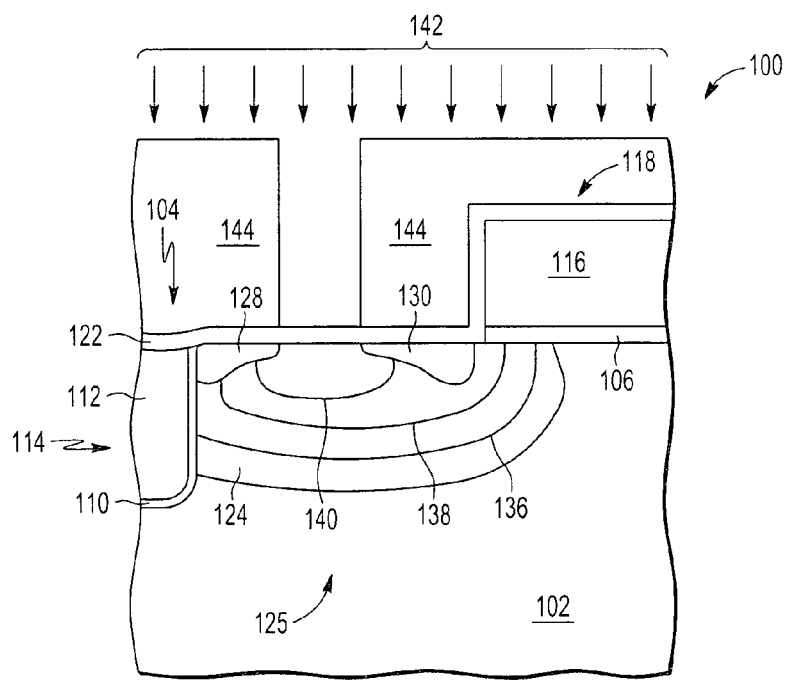

Referring now to FIG. 10, after forming the source regions 128, 130, the fabrication process continues by forming enhancement regions 136, 138, 140 within the body region 124 by implanting ions (illustrated by arrows 142) of the same conductivity-determining impurity type as the body region 124. In this regard, the regions 124, 136, 138, 140 collectively provide the body region of the device structure 100. In an exemplary embodiment, the body enhancement regions 136, 138, 140 are formed by masking the device structure 100 with an implantation mask 144 that masks the gate structures 114, 118 and source regions 128, 130 and leaves exposed the central (or interior) portion of the silicon material 102 and/or body region 124 disposed between the source regions 128, 130. The body enhancement regions 136, 138, 140 are then formed by performing a chain implant to provide the desired dopant profile. In this regard, in an exemplary embodiment, a deep ion implantation is performed to create the deep body enhancement region 136, followed by an intermediate ion implantation to create the intermediate body enhancement region 138, followed by a shallow ion implantation to create the shallow body enhancement region 140. After implanting ions 142, the fabrication process continues by removing the mask 144 and performing a high-temperature annealing process to drive the implanted ions and activate the body enhancement regions 136, 138, 140. In an exemplary embodiment, a rapid thermal annealing is performed to heat the device structure 100 to a temperature in the range of about 500° C. to about 1000° C.

For the exemplary N-channel device described herein, the body enhancement regions 136, 138, 140 are formed by implanting P-type ions such that the body enhancement regions 136, 138, 140 function as P+ body regions for the N-channel device. In an exemplary embodiment, the deep body enhancement region 136 is formed by implanting P-type ions (e.g., boron ions) with a dopant concentration of about $1 \times 10^{13}/cm^3$ and energy level in the range of about 160 keV to about 260 keV. After forming the deep body enhancement region 136, the intermediate body enhancement region 138 is formed by implanting P-type ions with a dopant concentration of about $2 \times 10^{15}/cm^3$ and energy level of about 80 keV. After forming the intermediate body enhancement region 138, the shallow body enhancement region 140 is formed by implanting P-type ions with a dopant concentration of about $1.2 \times 10^{15}/cm^3$ and energy level in the range of about 20 keV to about 50 keV. By virtue of the different energy levels for the ion implantations steps, after the implanted ions diffuse during the anneal, the depth of the deep body enhancement region 136 is less than the depth of the P-body region 124 relative to the surface of the silicon material 102, the depth of the intermediate body enhancement 138 is less than the depth of the deep body enhancement region 136, and the depth of the shallow body enhancement region 140 is less than the depth of the intermediate body enhancement 138, as illustrated in FIG. 10. By virtue of the chain implantation steps, the shallow body enhancement region 140 has the highest dopant concentration, the intermediate body enhancement region 138 has a lower dopant concentration than the shallow body enhancement region 140, the deep body enhancement region 136 has a lower dopant concentration than the intermediate body enhancement region 136, and the P-body region 124 has a lower dopant concentration than the deep body enhancement region 136. In addition to enhancing the dopant concentration of the body of the device structure 100, the body enhancement regions 136, 138, 140 avoid creation of parasitic bipolar transistors and improve the energy handling capability of the device structure 100.

Figure 11:
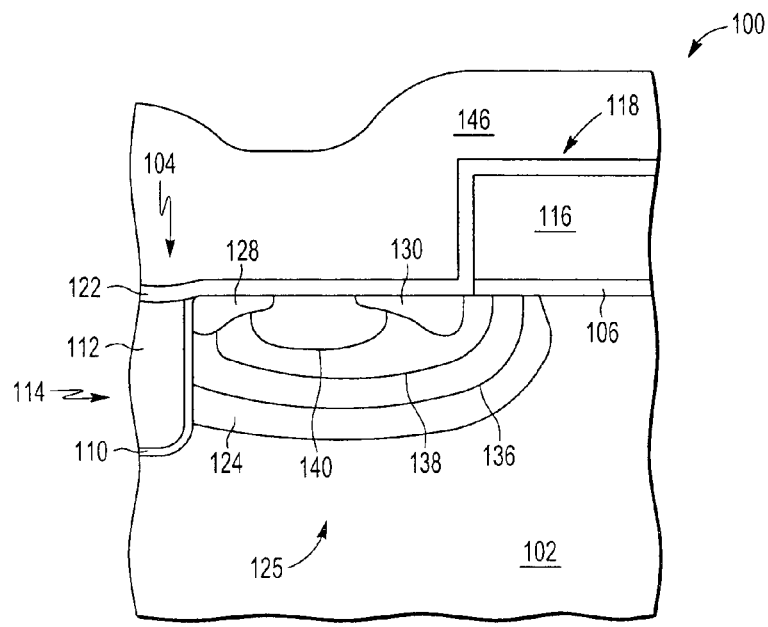

Referring now to FIG. 11, after forming the body enhancement regions 136, 138, 140, the fabrication process continues by forming a layer of a dielectric material 146 overlying the gate structures 114, 118, the source regions 128, 130, and the body regions 124, 136, 138, 140. In an exemplary embodiment, the layer of dielectric material 146 is formed by conformably depositing an oxide material, such as silicon dioxide, at a temperature in the range of about 700° C. to about 1000° C. to a thickness of about 500 nm overlying the gate structures 114, 118, the source regions 128, 130, and the body regions 124, 136, 138, 140 to obtain the device structure 100 illustrated in FIG. 11. The dielectric material 146 functions as an intralayer dielectric layer that electrically isolates the gate structures 114, 118 from a subsequently formed conductive layer, as described in the context of FIG. 12.

Figure 12:
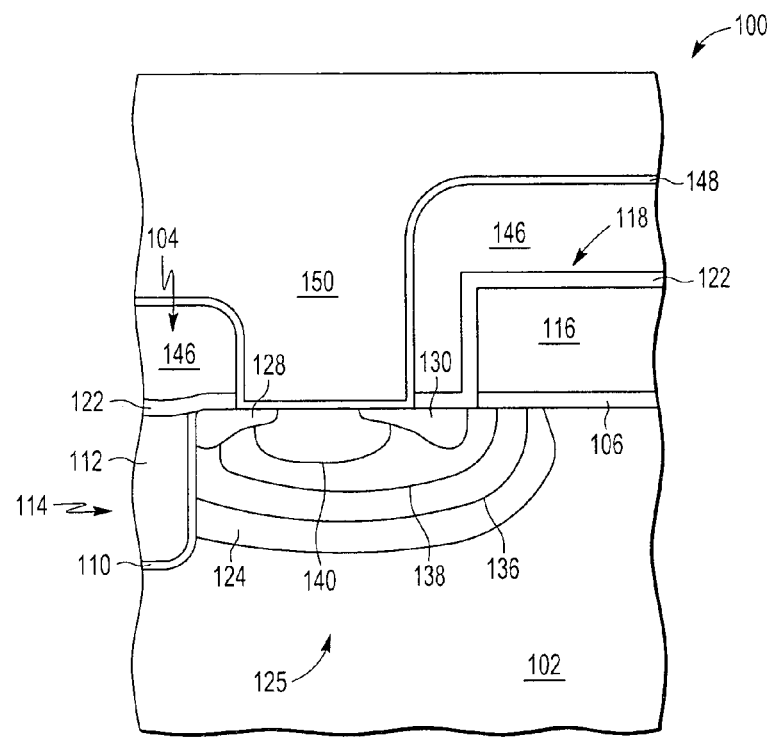

Referring now to FIG. 12, in an exemplary embodiment, after forming the layer of dielectric material 146, the fabrication process continues by selectively removing portions of the dielectric material 146 overlying at least a portion of the source regions 128, 130 and the portion of the body region 124, 136, 138, 140 disposed between the source regions 128, 130. In this regard, a masking material may be applied to mask the portions of the dielectric material 146 overlying the gate structures 114, 118 and patterned to expose the portion of the dielectric material 146 that overlies at least a portion of the source regions 128, 130 and the portion of the body region 124, 136, 138, 140 between the source regions 128, 130. The exposed portion of the dielectric material 146 is then removed by performing RIE using an anisotropic etchant chemistry that is selective to the masking material. In this manner, portions of the dielectric material 146 overlying the gate structures 114, 118 remain intact while portions of the dielectric material 146 overlying at least a portion of the source regions 128, 130 and the portion of the body region 124, 136, 138, 140 between the source regions 128, 130 are removed, as illustrated by FIG. 12.

In an exemplary embodiment, after selectively removing portions of the dielectric material 146, the fabrication process continues by forming one or more layers of conductive material 148, 150 overlying the exposed portions of the source regions 128, 130 and body region 124, 136, 138, 140, resulting in the device structure 100 of FIG. 12. In an exemplary embodiment, a first layer of a conductive material 148 is formed by conformably depositing a conductive metal material, such as titanium nitride, at a temperature in the range of about 400° C. to about 1000° C. to a thickness between about 10 nm to about 100 nm overlying the remaining dielectric material 146 and the exposed portions of the source regions 128, 130 and body region 124, 136, 138, 140. The conductive material 148 contacts the source regions 128, 130 and the body region 124, 136, 138, 140 to provide an electrical connection between the source regions 128, 130 and the body region 124, 136, 138, 140 of the device structure 100. In this manner, the source regions 128, 130 and the body region 124, 136, 138, 140 have the same electrical potential.

In an exemplary embodiment, after forming the first layer of conductive material 148, a second layer of conductive material 150 is formed by conformably depositing another conductive metal material, such as a copper material, at a temperature in the range of about 400° C. to about 1000° C. to a thickness of about 0.4 microns overlying the conductive metal material 148. In this manner, the conductive metal material 150 is electrically connected to the source regions 128, 130 and the body region 124, 136, 138, 140 via the underlying conductive metal material 148 while being insulated or otherwise isolated from the gate structures 114, 118 by the dielectric material 146. In an exemplary embodiment, the conductive metal material 150 functions as a source terminal for the device structure 100 that is capable of being accessed or otherwise being connected to external devices or overlying metal interconnect layers in a conventional manner. In this regard, the conductive metal material 150 provides a metal contact for the device structure 100 while conductive material 148 provides a thin buffer layer for an improved contact between the conductive metal material 150 and the source regions 128, 130 and the body region 124, 136, 138, 140.

Still referring to FIG. 12, the completed hybrid trench VDMOS device structure 100 includes a trench transistor structure (or trench MOSFET) and a VDMOS transistor structure. The trench transistor structure is comprised of the trench gate structure 114 (e.g., oxide material 110 and first polysilicon material 112), the source region 128 adjacent to the trench gate structure 114 and/or trench 104, a portion of the drain region 125 adjacent to the trench gate structure 114 and/or trench 104, and the portion of the body region 124, 136, 138, 140 that is adjacent to the trench gate structure 114 and/or trench 104 and disposed vertically between the source region 128 and the portion of the drain region 125 adjacent to the trench gate structure 114 and/or trench 104. The VDMOS transistor structure is comprised of the lateral gate structure 118 (e.g., dielectric material 106 and second polysilicon material 116), the portion of the drain region 125 adjacent to and underlying the lateral gate structure 118, the portion of the body region 124, 136, 138, 140 adjacent to and underlying the lateral gate structure 118, and the source region 130 adjacent to the lateral gate structure 118 (e.g., the source region 130 adjacent to the portion of the body region 124, 136, 138, 140 adjacent to and underlying the lateral gate structure 118). In this regard, the drain region 125 and the body region 124, 136, 138, 140 are shared by the trench transistor structure and the VDMOS transistor structure.

By virtue of the electrical connection between the trench gate structure 114 and the lateral gate structure 118, when a voltage above a threshold voltage for the hybrid trench VDMOS device structure 100 is applied to the gate structures 114, 118 (e.g., to portion 120), a first conductive channel is created that runs vertically along the trench gate structure 114 (e.g., along trench sidewall surface 105) within the portion of the body region 124, 136, 138, 140 between the N+ drain region 125 and the N+ source region 128 and a second conductive channel is created that runs horizontally (or laterally) along the lateral gate structure 118 within the portion of the body region 124, 136, 138, 140 between the N+ drain region 125 and the N+ source region 130. In this manner, the total current flowing through the hybrid trench VDMOS device structure 100 is distributed among the two conductive channels, thereby allowing the energy consumed by the device structure 100 to be dissipated vertically and horizontally. Thus, by distributing the current among two conductive channels aligned in different directions to distribute energy in multiple directions, the hybrid trench VDMOS device structure 100 achieves a more uniform thermal distribution and allows for the die size (or area) of the hybrid trench VDMOS device structure 100 to be reduced relative to the convention trench MOSFET to achieve the same current and/or energy handling capability. In other words, to achieve a desired current handling and/or energy handling requirement, the hybrid trench VDMOS device structure 100 requires less area than the conventional trench MOSFET. The properties of the dielectric material 110 and/or conductive material 112 for the trench gate structure 114 (e.g., thicknesses, dielectric constants, and the like) may be chosen to optimize performance of the trench transistor portion of the hybrid trench VDMOS device structure 100 independently of the properties of the dielectric material 106 and/or conductive material 116 for the lateral gate structure 118 (e.g., thicknesses, dielectric constants, and the like), which in turn, may be independently chosen to optimize performance and/or dielectric constant of the dielectric material 106 may be chosen to optimize performance of the VDMOS transistor portion of the hybrid trench VDMOS device structure 100.

Figure 13:
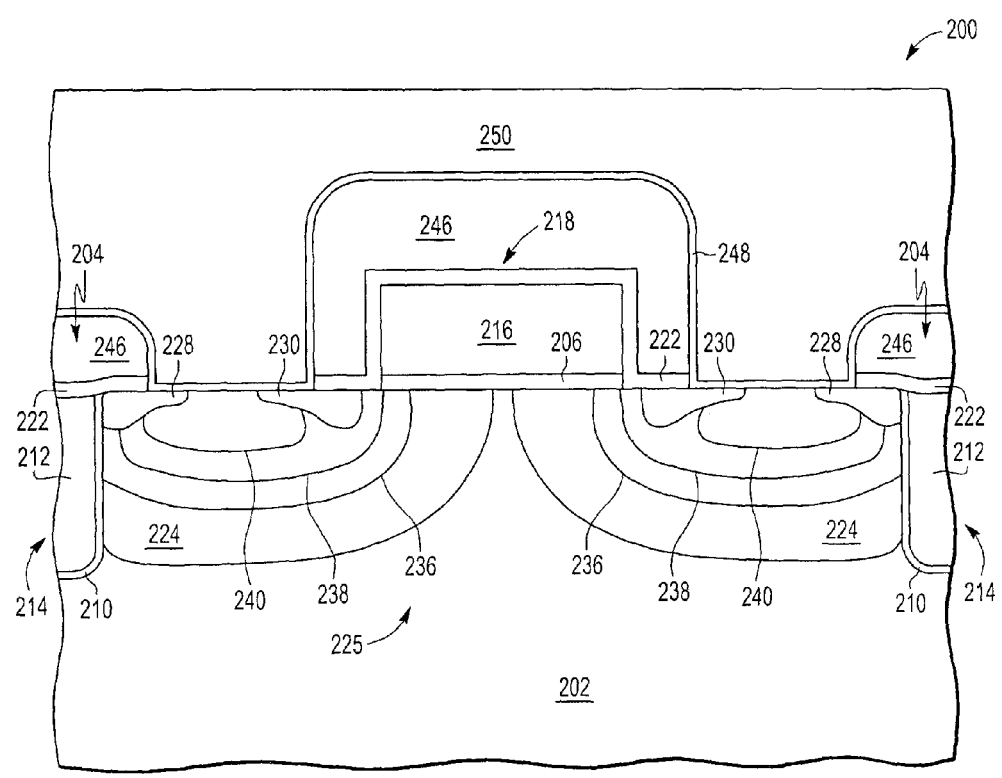
FIG. 13 illustrates a cross-sectional view of a semiconductor device structure in accordance with another embodiment of the invention.

Referring now to FIG. 13, in accordance with one or more embodiments, the fabrication process described above in the context of FIGS. 1-12 may be performed to fabricate a semiconductor device structure 200 having a pair of trench gate structures 214 and a single lateral gate structure 218 disposed between the trench gate structures 214. In this regard, trench gate structures 214 comprised of a conductive material 212 and a dielectric material 210 may be formed in trenches 204 formed on opposing sides of a region of semiconductor material 202 having a first conductivity type. After forming the trench gate structures 214, the lateral gate structure 218 comprising a conductive material 216 and a dielectric material 206 is formed overlying the semiconductor material 202, wherein the lateral gate structure 218 is disposed overlying the semiconductor material 202 between the trench gate structures 214, leaving exposed portions of the semiconductor material 202 between the lateral gate structure 218 and the trench gate structures 214. As described above, after forming the lateral gate structure 218, a layer of dielectric material 222 is formed overlying the gate structures 214, 218 and the semiconductor material 202, and deep body regions 224 are formed adjacent to each trench gate structure 214 by implanting ions having a second conductivity type into the portions of semiconductor material 202 between the lateral gate structure 218 and the trench gate structures 214. In this regard, the lateral gate structure 218 masks the interior (or central) portion of the semiconductor material 202 between the trench gate structures 214. As described above, the implanted ions diffuse laterally such that the body regions 224 extend laterally underneath the lateral gate structure 218. After forming the body regions 224, a mask is formed that overlies the interior (or central) portions of the body regions 224 and exposes portions of the body regions 224 adjacent to the trench gate structures 214 and the lateral gate structure 218, and ions of the first conductivity type are implanted into the exposed portions of the body regions 224 using the mask and the lateral gate structure 218 as implantation mask to form trench transistor source regions 228 within the body regions 224 adjacent to the trench gate structures 214 and VDMOS transistor source regions 230 within the body regions 224 adjacent to the lateral gate structure 218. After forming the source regions 228, 230, the source regions 228, 230 and the gate structures 214, 218 are masked, and ions having the same conductivity type as the body region 224 are implanted into the exposed interior (or central) portions of the body regions 224 between source regions 228, 230 to form body enhancement regions 236, 238, 240. As illustrated, the source regions 228 are separated from source regions 230 by the interior (or central) portions of the body regions 224, 236, 238, 240. After forming the body enhancement regions 236, 238, 240, a dielectric material 246 is formed overlying the gate structures 214, 218 that leaves exposed portions of the source regions 228, 230 and the interior (or central) portions of the body regions 224, 236, 238, 240 between gate structures 214, 218, and conductive materials 248, 250 are formed overlying the exposed portions of the source regions 228, 230 and the exposed portions of the body regions 224, 236, 238, 240. The conductive materials 248, 250 are electrically connected to the source regions 228, 230 and the body regions 224, 236, 238, 240 while being insulated or otherwise isolated from the gate structures 214, 218 by the dielectric material 246, and the uppermost conductive material 250 functions as a source terminal for the device structure 200 that is capable of being accessed or otherwise being connected to external devices or overlying metal interconnect layers in a conventional manner, as described above.

By virtue of the electrical connection between the conductive material 212 of the trench gate structures 214 and the conductive material 216 of the lateral gate structure 218, when a voltage above a threshold voltage for the semiconductor device structure 200 is applied to the gate structures 214, 218, a pair of conductive channels are created that run vertically along the trench gate structures 214 between the portions of the body regions 224, 236, 238, 240 adjacent to the trench gate structures 214 between the drain region 225 and the source regions 228. Additionally, a pair of conductive channels are created that run horizontally (or laterally) beneath the lateral gate structure 218 within the portions of the body regions 224, 236, 238, 240 between the portion of the drain region 225 underlying the lateral gate structure 218 and the source regions 230. In this manner, the current flowing through the device structure 200 is distributed among a greater area, thereby allowing the energy consumed by the device structure 200 to be dissipated over a greater area. Thus, by distributing the current vertically and horizontally, heat is dissipated vertically and horizontally and the device structure 200 achieves a more uniform thermal distribution, which, in turn, allows for the die size (or area) of the device structure 200 to be reduced relative to the conventional trench MOSFET to achieve the same current and/or energy handling capability.

In conclusion, apparatus and methods configured in accordance with example embodiments of the invention relate to:

An apparatus for a semiconductor device structure is provided. In an exemplary embodiment, the semiconductor device structure includes a trench gate structure, a lateral gate structure; a body region of semiconductor material having a first conductivity type, a first source region of semiconductor material having a second conductivity type, a second source region of semiconductor material having the second conductivity type, and a drain region of semiconductor material having the second conductivity type. The first source region is formed within the body region adjacent to the trench gate structure, the second source region is formed within the body region, and the drain region is adjacent to the body region. A first portion of the body region disposed between the first source region and the drain region is adjacent to the trench gate structure, and the lateral gate structure overlies a second portion of the body region disposed between the second source region and the drain region. In one embodiment, a first portion of the drain region is adjacent to the trench gate structure, and the first portion of the body region overlies the first portion of the drain region. In a further embodiment, the first source region overlies the first portion of the body region, and the first portion of the body region is disposed between the first portion of the drain region and the first source region. In another embodiment, a second portion of the drain region is adjacent to the lateral gate structure, wherein the lateral gate structure overlies the second portion of the drain region, and the second portion of the body region is disposed between the second portion of the drain region and the second source region. In one embodiment, the trench gate structure and the lateral gate structure are electrically connected to provide a gate terminal for the semiconductor device structure, wherein an electrical potential applied to the gate terminal results in a vertical conductive channel in the first portion of the body region between the first portion of the drain region and the first source region and a horizontal conductive channel in the second portion of the body region between the second portion of the drain region and the second source region. In another embodiment, a third portion of the body region is disposed between the first portion and the second portion. In yet another embodiment, the second source region is adjacent to the lateral gate structure.

In another embodiment, a method for fabricating a semiconductor device structure is provided. The method comprises the steps of forming a voided region in a first region of semiconductor material having a first conductivity type, forming a first gate structure in the voided region, forming a second gate structure overlying the first region, forming a second region of semiconductor material having a second conductivity type within the first region of semiconductor material, forming a third region of semiconductor material having the first conductivity type within the second region adjacent to the first gate structure, and forming a fourth region of semiconductor material having the first conductivity type within the second region. A first portion of the second region is adjacent to the first gate structure and a second portion of the second region is underlying the second gate structure, the third region overlies the first portion of the second region, and the fourth region is adjacent to the second portion of the second region. In accordance with one embodiment, the first region comprises a drain/source region having the first conductivity type, wherein forming the second region comprises forming a body region having the second conductivity type within the drain/source region, forming the third region comprises forming a first source/drain region having the first conductivity type within the body region adjacent to the first gate structure, and forming the fourth region comprises forming a second source/drain region having the first conductivity type within the body region. In another embodiment, forming the second gate structure comprises forming a layer of conductive material overlying the first region and removing a portion of the layer of conductive material to expose a first portion of the first region, the first portion being adjacent to the first gate structure. In one alternate embodiment, forming the second region comprises performing a chain implant to form a plurality of enhancement regions within the second region. In yet another embodiment, forming the third region comprises implanting ions of the first conductivity-determining impurity type in the first portion of the second region and forming the fourth region comprises implanting ions of the first conductivity-determining impurity type in the second portion of the second region. In a further embodiment, the method further comprises the step of forming an implantation mask overlying a central portion of the second region, wherein forming the third region comprises implanting ions of a first conductivity-determining impurity type in the first portion using the implantation mask, and forming the fourth region comprises implanting ions of the first conductivity-determining impurity type in the second portion using the implantation mask concurrently to implanting ions of the first conductivity-determining impurity type in the first portion. In accordance with another embodiment, forming the first gate structure comprises forming a layer of dielectric material in the voided region and forming a layer of conductive material in the voided region after forming the layer of dielectric material, the layer of dielectric material being disposed between the layer of conductive material and the first region. In yet another embodiment, the method further comprises the step of forming a region of conductive material in contact with the first gate structure and the second gate structure to provide an electrical connection between the first gate structure and the second gate structure. In accordance with another embodiment, the method further comprises the step of forming a layer of conductive material overlying and in contact with the second region, the third region, and the fourth region to provide an electrical connection between the second region, the third region, and the fourth region.

In accordance with another embodiment, an apparatus for a semiconductor device structure is provided. The semiconductor device structure includes a first transistor structure and a second transistor structure. The first transistor structure includes a trench gate structure, a drain region of semiconductor material having a first conductivity type, a body region of semiconductor material having a second conductivity type, the body region overlying the drain region adjacent to the trench gate structure, and a first source region of semiconductor material having the first conductivity type, the first source region being formed within the body region adjacent to the trench gate structure. The second transistor structure includes a lateral gate structure overlying a first portion of the drain region and a first portion of the body region, the first portion of the drain region being adjacent to the lateral gate structure, and a second source region of semiconductor material having the first conductivity type, the second source region being formed within the body region, wherein the first portion of the body region is disposed between the second source region and the first portion of the drain region. In one embodiment, the semiconductor device structure further comprises a region of conductive material in contact with the trench gate structure and the lateral gate structure. In another embodiment, the semiconductor device structure further comprises a conductive material in contact with the first source region, the second source region, and the body region.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device structure comprising:
   a trench gate structure;
   a lateral gate structure;
   a body region of semiconductor material having a first conductivity type;
   a first source region of semiconductor material having a second conductivity type, the first source region being formed within the body region adjacent to the trench gate structure;
   a second source region of semiconductor material having the second conductivity type, the second source region being formed within the body region;
   a drain region of semiconductor material having the second conductivity type, the drain region being adjacent to the body region, wherein:
      a first portion of the body region disposed between the first source region and the drain region is adjacent to the trench gate structure; and
      the lateral gate structure overlies a second portion of the body region disposed between the second source region and the drain region.

2. The semiconductor device structure of claim 1, wherein a first portion of the drain region is adjacent to the trench gate structure, the first portion of the body region overlying the first portion of the drain region.

3. The semiconductor device structure of claim 2, wherein the first source region overlies the first portion of the body region, the first portion of the body region being disposed between the first portion of the drain region and the first source region.

4. The semiconductor device structure of claim 2, wherein a second portion of the drain region is adjacent to the lateral gate structure, the lateral gate structure overlying the second portion of the drain region, the second portion of the body region being disposed between the second portion of the drain region and the second source region.

5. The semiconductor device structure of claim 4, wherein:
the trench gate structure and the lateral gate structure are electrically connected to provide a gate terminal for the semiconductor device structure; and
an electrical potential applied to the gate terminal results in a vertical conductive channel in the first portion of the body region between the first portion of the drain region and the first source region and a horizontal conductive channel in the second portion of the body region between the second portion of the drain region and the second source region.

6. The semiconductor device structure of claim 1, wherein a third portion of the body region is disposed between the first portion and the second portion.

7. The semiconductor device structure of claim 1, wherein the second source region is adjacent to the lateral gate structure.

8. The semiconductor device structure of claim 1, wherein the trench gate structure and the lateral gate structure are electrically connected.

9. A method for fabricating a semiconductor device structure, the method comprising:
forming a voided region in a first region of semiconductor material having a first conductivity type;
forming a first gate structure in the voided region;
forming a second gate structure overlying the first region;
forming a second region of semiconductor material having a second conductivity type within the first region of semiconductor material, wherein a first portion of the second region is adjacent to the first gate structure and a second portion of the second region is underlying the second gate structure;
forming a third region of semiconductor material having the first conductivity type within the second region adjacent to the first gate structure, the third region overlying the first portion of the second region;
forming a fourth region of semiconductor material having the first conductivity type within the second region, the fourth region being adjacent to the second portion of the second region.

10. The method of claim 9, wherein:
the first region comprises a drain/source region having the first conductivity type;
forming the second region comprises forming a body region having the second conductivity type within the drain/source region;
forming the third region comprises forming a first source/drain region having the first conductivity type within the body region adjacent to the first gate structure; and
forming the fourth region comprises forming a second source/drain region having the first conductivity type within the body region.

11. The method of claim 9, wherein forming the second gate structure comprises:
forming a layer of conductive material overlying the first region; and
removing a portion of the layer of conductive material to expose a first portion of the first region, the first portion being adjacent to the first gate structure.

12. The method of claim 9, wherein forming the second region comprises performing a chain implant to form a plurality of enhancement regions within the second region.

13. The method of claim 9, wherein:
forming the third region comprises implanting ions of the first conductivity-determining impurity type in the first portion of the second region; and
forming the fourth region comprises implanting ions of the first conductivity-determining impurity type in the second portion of the second region.

14. The method of claim 13, further comprising forming an implantation mask overlying a central portion of the second region, wherein:
forming the third region comprises implanting ions of a first conductivity-determining impurity type in the first portion using the implantation mask; and
forming the fourth region comprises implanting ions of the first conductivity-determining impurity type in the second portion using the implantation mask concurrently to implanting ions of the first conductivity-determining impurity type in the first portion.

15. The method of claim 9, wherein forming the first gate structure comprises:
forming a layer of dielectric material in the voided region; and
forming a layer of conductive material in the voided region after forming the layer of dielectric material, the layer of dielectric material being disposed between the layer of conductive material and the first region.

16. The method of claim 9, further comprising forming a region of conductive material in contact with the first gate structure and the second gate structure to provide an electrical connection between the first gate structure and the second gate structure.

17. The method of claim 9, further comprising forming a layer of conductive material overlying and in contact with the second region, the third region, and the fourth region to provide an electrical connection between the second region, the third region, and the fourth region.

18. A semiconductor device structure comprising:
a first transistor structure comprising:
a trench gate structure;
a drain region of semiconductor material having a first conductivity type;
a body region of semiconductor material having a second conductivity type, the body region overlying the drain region adjacent to the trench gate structure; and
a first source region of semiconductor material having the first conductivity type, the first source region being formed within the body region adjacent to the trench gate structure; and
a second transistor structure comprising:
a lateral gate structure overlying a first portion of the drain region and a first portion of the body region, the first portion of the drain region being adjacent to the lateral gate structure; and
a second source region of semiconductor material having the first conductivity type, the second source region being formed within the body region, wherein the first portion of the body region is disposed between the second source region and the first portion of the drain region.

19. The semiconductor device structure of claim 18, further comprising a region of conductive material in contact with the trench gate structure and the lateral gate structure.

20. The semiconductor device structure of claim 18, further comprising a conductive material in contact with the first source region, the second source region, and the body region.

* * * * *